(12) United States Patent
Alcala et al.

(10) Patent No.: US 8,208,273 B1
(45) Date of Patent: Jun. 26, 2012

(54) RF SHIELDED ENCLOSURE FOR AUTOMATED TESTING

(75) Inventors: Osvaldo C Alcala, Chula Vista, CA (US); Kent Steven Doub, Spring Valley, CA (US); Robert W Ellis, San Diego, CA (US); Octavio D Martinez, Chula Vista, CA (US); Patrick Sumner, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 1048 days.

(21) Appl. No.: 12/139,348

(22) Filed: Jun. 13, 2008

(51) Int. Cl.
*H05K 9/00* (2006.01)
(52) U.S. Cl. ........................................... 361/817
(58) Field of Classification Search .................. 361/817, 361/796, 816, 818
See application file for complete search history.

(56) References Cited

U.S. PATENT DOCUMENTS 5,585,808 A * 12/1996 Wysome ...................... 343/703
6,657,214 B1 12/2003 Foegelle et al.

FOREIGN PATENT DOCUMENTS
WO  WO2006136000   12/2006

OTHER PUBLICATIONS

International Search Report and Written Opinion—PCT/US2009/046625—International Search Authority, European Patent Office—Feb. 8, 2010.

* cited by examiner

*Primary Examiner* — Jeremy Norris
*Assistant Examiner* — Tremesha S Willis
(74) *Attorney, Agent, or Firm* — Jonathan Velasco; William M. Hooks (57) ABSTRACT

An apparatus for restricting the flow of RF energy when attached to a tester wherein test equipment is positioned within the apparatus, comprising: a lid; a base; hinges for attaching the lid to the base; EMI gasket material for sealing seams; latches for attaching the lid to the base and for applying forces between the lid and the base to provide compression of the EMI gasket material for proper sealing of the seams; a connection point for providing two axis alignment of the base to the tester; and a positioning plate for providing three axis alignment of the test equipment in relation to the tester.

10 Claims, 10 Drawing Sheets

RF SHIELDED ENCLOSURE FOR AUTOMATED TESTING

FIELD

This disclosure relates to the shielding of electronic equipment from electromagnetic interference (EMI). More particularly, there is presented a RF shielded enclosure that attaches to testers and allows for the use of automated as well as non-automated test equipment.

BACKGROUND

The manufacture and subsequent testing of electronic components generates electromagnetic energy at least in the form of radio frequency RF. The RF energy generated, if not shielded, emanates throughout the manufacturing building potentially causing interference to any of the activities in the building. RF energy from outside the manufacturing facility may also penetrate into the building and cause interference.

One tool that is used to isolate a particular area within a RF rich environment is a screen room. These are large rooms covered entirely with costly RF shielding material such as copper mesh. They take a lot of time to build and consume valuable floor space. Over time the rooms deteriorate in their effectiveness and require costly and time consuming replacement.

Screen rooms house the test equipment. Items to be tested are brought into the screen room. Time is consumed in transporting the items under test. To reduce this time to transport, screen room location is restricted to being as close as possible to the point where the electronic components come off the manufacturing line.

This close proximity location further increases the cost of using screen rooms because not just valuable floor space is consumed but extremely valuable manufacturing floor space close to the production lines is consumed.

The invention is made with the above discussed problems in mind and aims to address the related problems.

SUMMARY OF THE INVENTION

An apparatus for restricting the flow of RF energy when attached to a tester wherein test equipment is positioned within the apparatus, comprising: a lid; a base; hinges for attaching the lid to the base; EMI gasket material for sealing seams; latches for attaching the lid to the base and for applying forces between the lid and the base to provide compression of the EMI gasket material for proper sealing of the seams; a connection point for providing two axis alignment of the base to the tester; and a positioning plate for providing three axis alignment of the test equipment in relation to the tester.

Additional features and benefits of the present invention will become apparent from the detailed description, figures and claims set forth below.

DETAILED DESCRIPTION OF AN EMBODIMENT OF THE INVENTION

The description and accompanying drawings are for purposes of illustration and are not to be used to construe the disclosure in a restrictive manner. In the following description, specific details are set forth in order to provide a thorough understanding of the invention. However, it will be apparent to one of skill in the art that the invention can be practiced without these special details.

Figure 1:
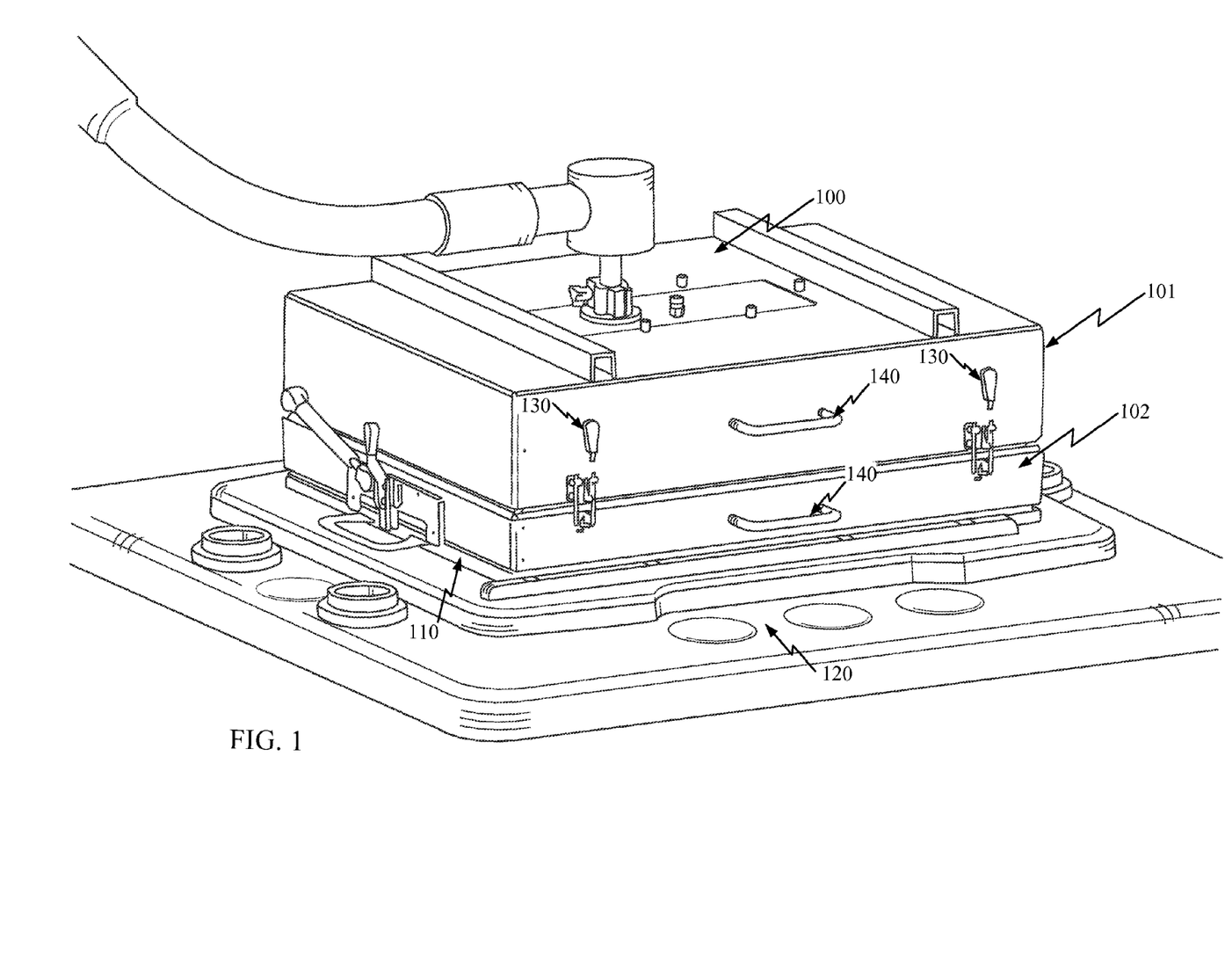
FIG. 1 is a drawing of the RF shielded enclosure attached to an industry standard tester.

Turning now to FIG. 1 of the accompanying drawings, there is shown RF shielded enclosure 100 attached to Test Board Frame 110 which is supported by Tester 120. RF shielded enclosure comprises lid 101 and base 102.

RF shielded enclosure 100 is constructed using metal for the basic shape. Metal naturally restricts or attenuates the passage of EMI energy or RF energy. Metal is durable, inexpensive and relatively easy to form. Those skilled in the art would understand that other materials could be used.

RF shielded enclosure 100 is small enough and constructed out of appropriate materials so that RF shielded enclosure 100 can be transported to the tester or to the items to be tested. Handles 140 are provided for efficient transport of the RF shielded enclosure 100 either alone or with equipment attached.

The RF shielded enclosure 100 can be designed to fit any test setup. Tester 120 and test board 110 and the environmental controller input 105 depict industry standard test equipment. This standard setup will be used for this disclosure. However, this should in no way be construed in anyway to limit the scope of the disclosure for RF shielded enclosure 100.

The RF shielded enclosure 100 is shown in the closed position with environmental controller input 105 shown routed from an environmental controller (not shown) through the lid 101. In this position, it is easily accessible during testing, stays solidly attached to the RF shielded enclosure 100 and swings out of the way when the RF shielded enclosure 100 is opened.

Latches 130 apply force to hold the lid 101 to the base 102 when closed. The force also helps to compress EMI gasket material (better illustrated in later figures) to provide proper RF shielding at the junctures. The term proper is used to describe implementation practices that achieve the goals set out for that portion of the design. The overall shielding affect is proper when the level of attenuation desired for the RF shielded enclosure 100 is achieved.

Figure 2:
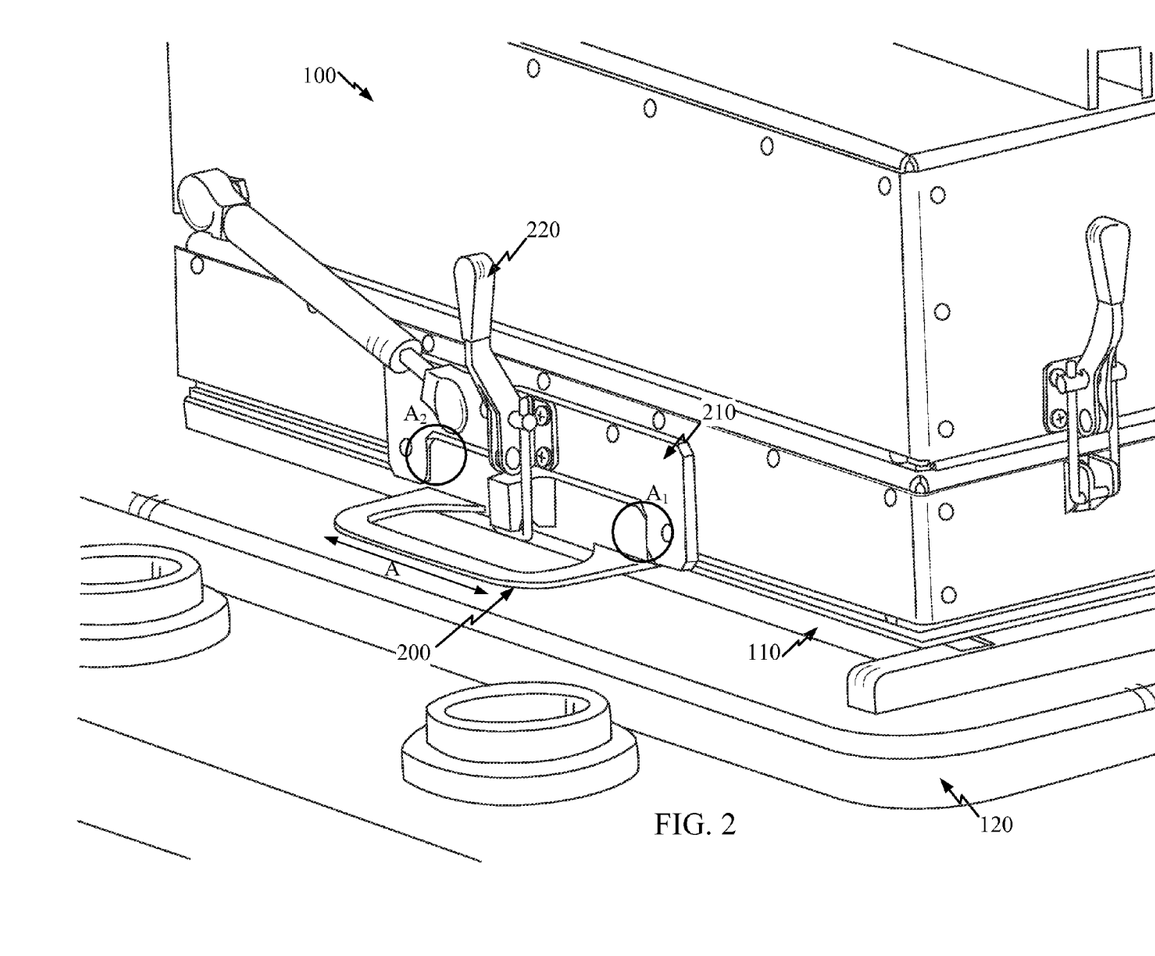
FIG. 2 is a closer view of the attachment hardware used to attach RF shielded enclosure to the tester.

FIG. 2 shows in closer detail the attachment of RF shielded enclosure 100 to test board 110. FIG. 2 represents only one side of the RF shielded enclosure 100. It would be obvious to those skilled in the art that multiple connection points can be used. If the RF shielded enclosure 100 comprises multiple sides that are not in direct opposition to each other, or if it is irregular in shape or has curved edges, then multiple connection points may be used to adequately secure the RF shielded enclosure 100 to the test equipment.

In this embodiment two connection points are used, the one depicted by FIG. 2 and another positioned on the opposite side of RF shielded enclosure 100. They are similar in design. Therefore the discussion depicted in FIG. 2 is readily transferable to the opposite side connection point. As will be shown the connection points are different in that they function as a pair. They apply aligning forces in opposing directions to bracket the RF shielded enclosure 100 into the proper position on test board 110.

Frame handle 200 is attached to test board frame 110. Alignment place 210 is attached to RF shielded enclosure 100. Latching clamp 220 is connected to alignment plate 210 and clamps to Frame handle 200. Latching clamp 220 provides the connecting force needed to hold RF shielded enclosure 100 to test board frame 110.

Frame handle 200 is designed to join with alignment plate 210 so as to provide two axis alignment of the RF shielded enclosure 100 to the test board frame 110. Frame handle 200 is not part of the industry standard test equipment. Frame handle 200 may be a replacement to a preexisting handle; however, frame handle 200 is designed in concert with RF shielded enclosure 100, alignment place 210, test board frame 110 and Tester 120.

The region designated by A1 and A2 where frame handle 200 and alignment plate 210 make contact restricts movement between the test board frame 110 and RF shielded enclosure along the indicated A axis. This provides A axis alignment.

Figure 3:
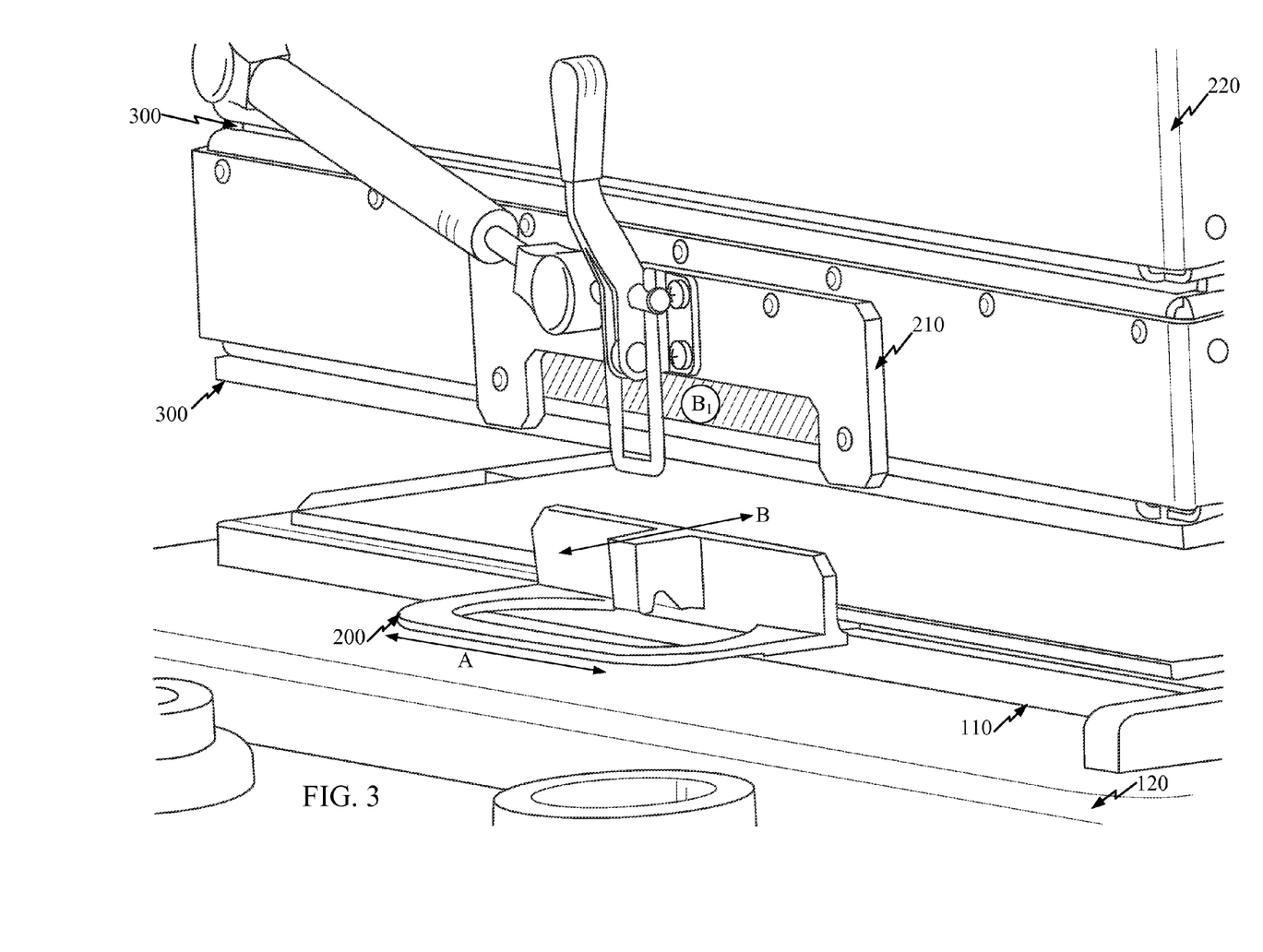
FIG. 3 is a partially exploded view of the attachment hardware for attaching RF shielded enclosure to a tester.

FIG. 3 shows RF shielded enclosure 100 lifted slightly from test board frame 110.

The region designated B1 of RF shielded enclosure 100 makes contact with the inner surface of Frame handle 200. Once RF shielded enclosure 100 is joined to test board frame 110 this contact surface between the two restricts motion along the B axis in one direction. The second connection point on the opposite side of RF shielded enclosure 100 similarly restricts motion. However this opposite connection point restricts motion along the B axis in the opposite direction of the connection represented in the FIGS. 2 and 3. This provides B axis alignment.

Thus two axis alignment (A and B axis) is achieved. The accuracy of this alignment influences the operation of RF shielded enclosure 100 as will be further described.

It would be obvious to those skilled in the art that different designs may be used for achieving alignment and clamping, comprising: automated alignment tools and techniques, alignment pins, feedback mechanisms and robotic actuators.

Also in FIG. 3, gasket material 300 can be seen attached to the underside of RF shielded enclosure 100. The gasket material 300 used here in the contact seams and in other places in the RF shielded enclosure seal against EMI or RF leaks into or out of the RF shielded enclosure 100.

Figure 4:
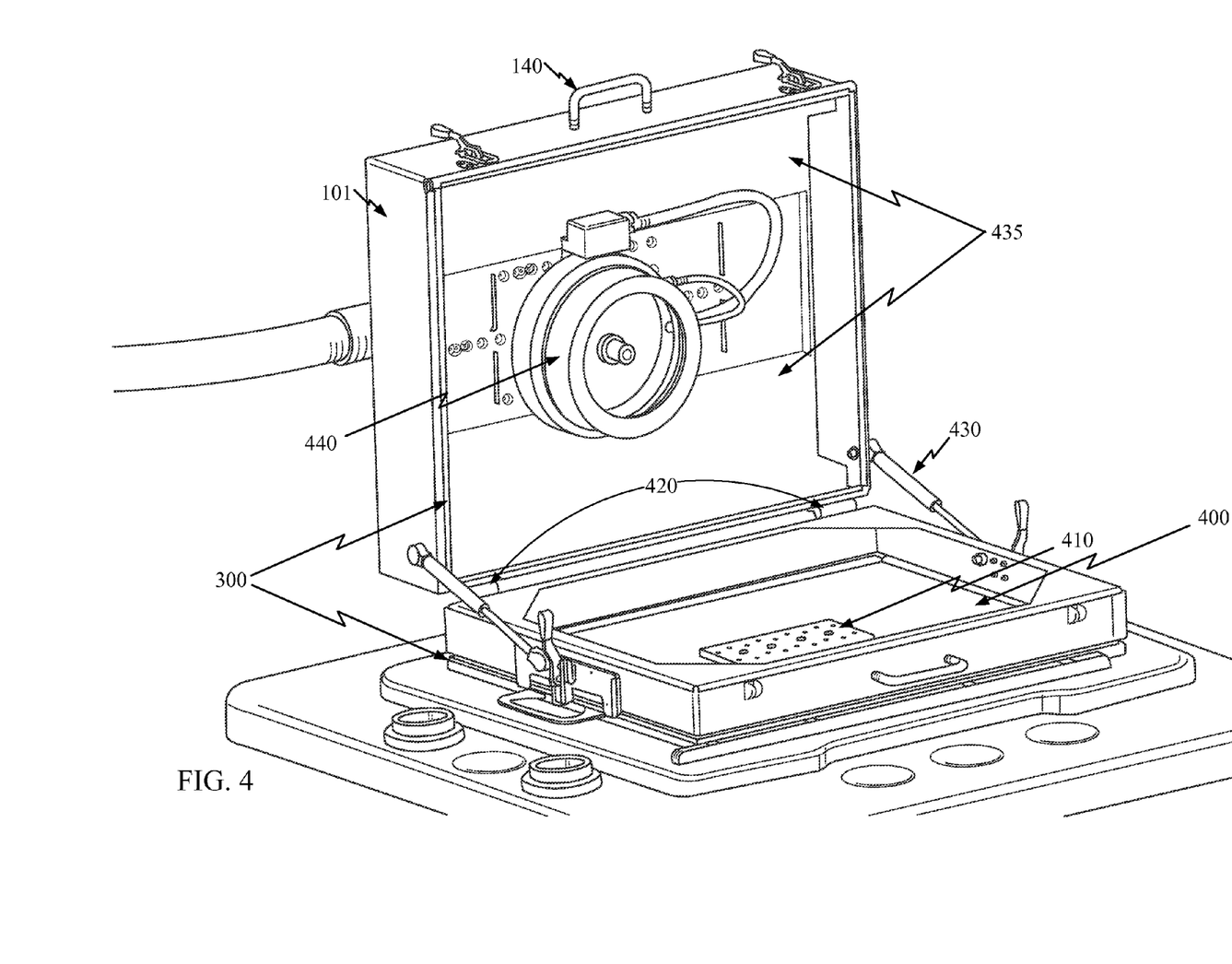
FIG. 4 is a drawing of the RF shielded enclosure when open.

FIG. 4 shows RF shielded enclosure 100 opened. When opened the RF shielded enclosure 100 provides access to the test interface board 400. Test interface board 400 is supported by test board frame 110. Positioned on the test interface board 400 are test sockets 410 where electronic hardware, comprising microprocessors are positioned for testing. RF shielded enclosure 100 covers, protects and shields the entire test interface board 400.

Hinges 420 allow for opening of the RF shielded enclosure 100. Gas springs 430 connected to the lid 101 and base 102 assist with the operation of the lid 101. RF energy absorbing material 435 attached in various locations provides attenuation of EMI energy that is reflected within the RF shielded enclosure 100. Industry standard environmental control chamber 440 is shown. Not shown also is the use of metallic tape to seal corners, cracks and voids in the metal structure.

As already discussed, the use of handles 140 on RF shielded enclosure 100 provides efficient transportation capabilities. Here RF shielded Enclosure 100 may be transported with test interface board 400 attached.

Figure 5:
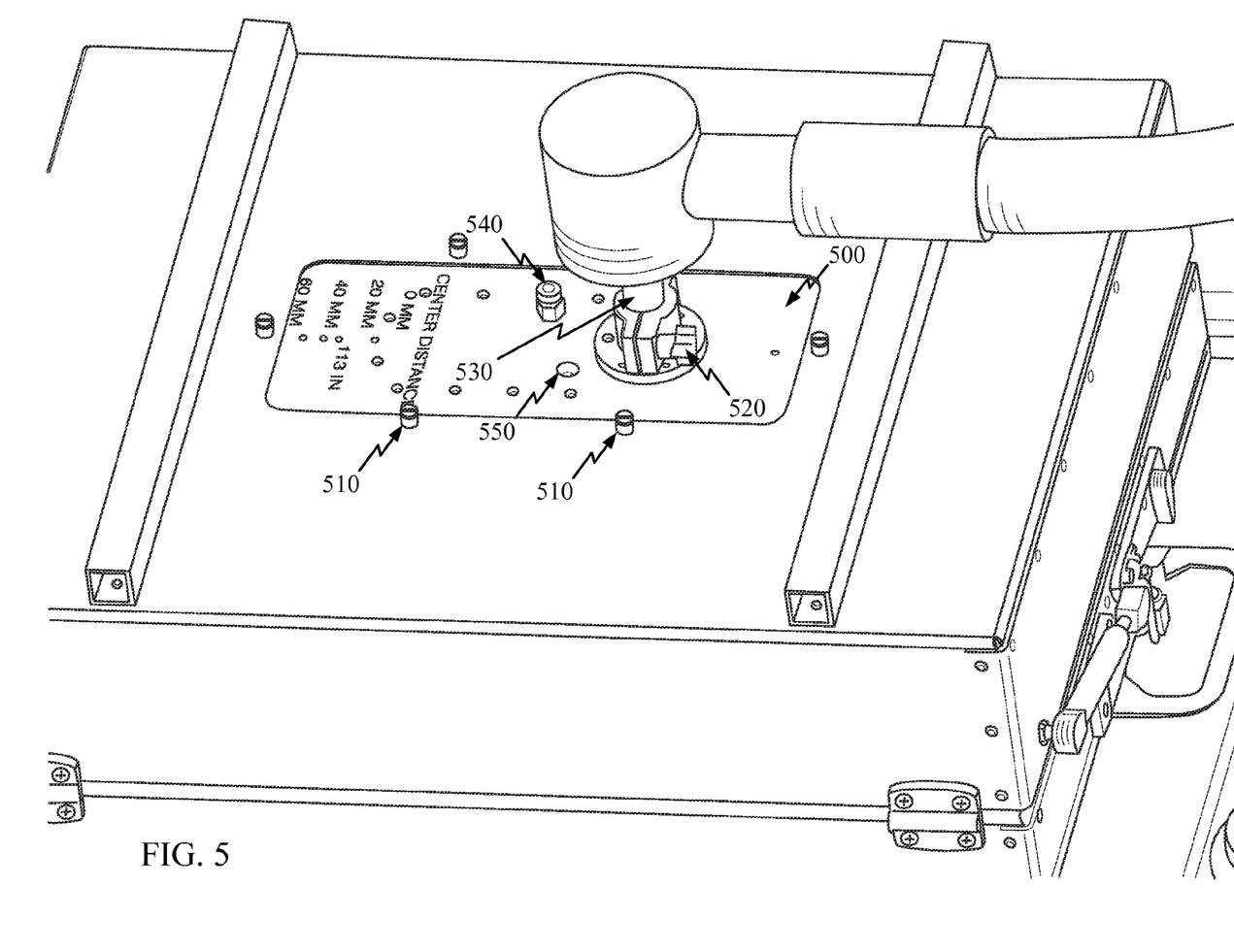
FIG. 5 is a drawing of detail of the lid of the RF shielded enclosure showing the environmental control positioning plate.
Figure 6:
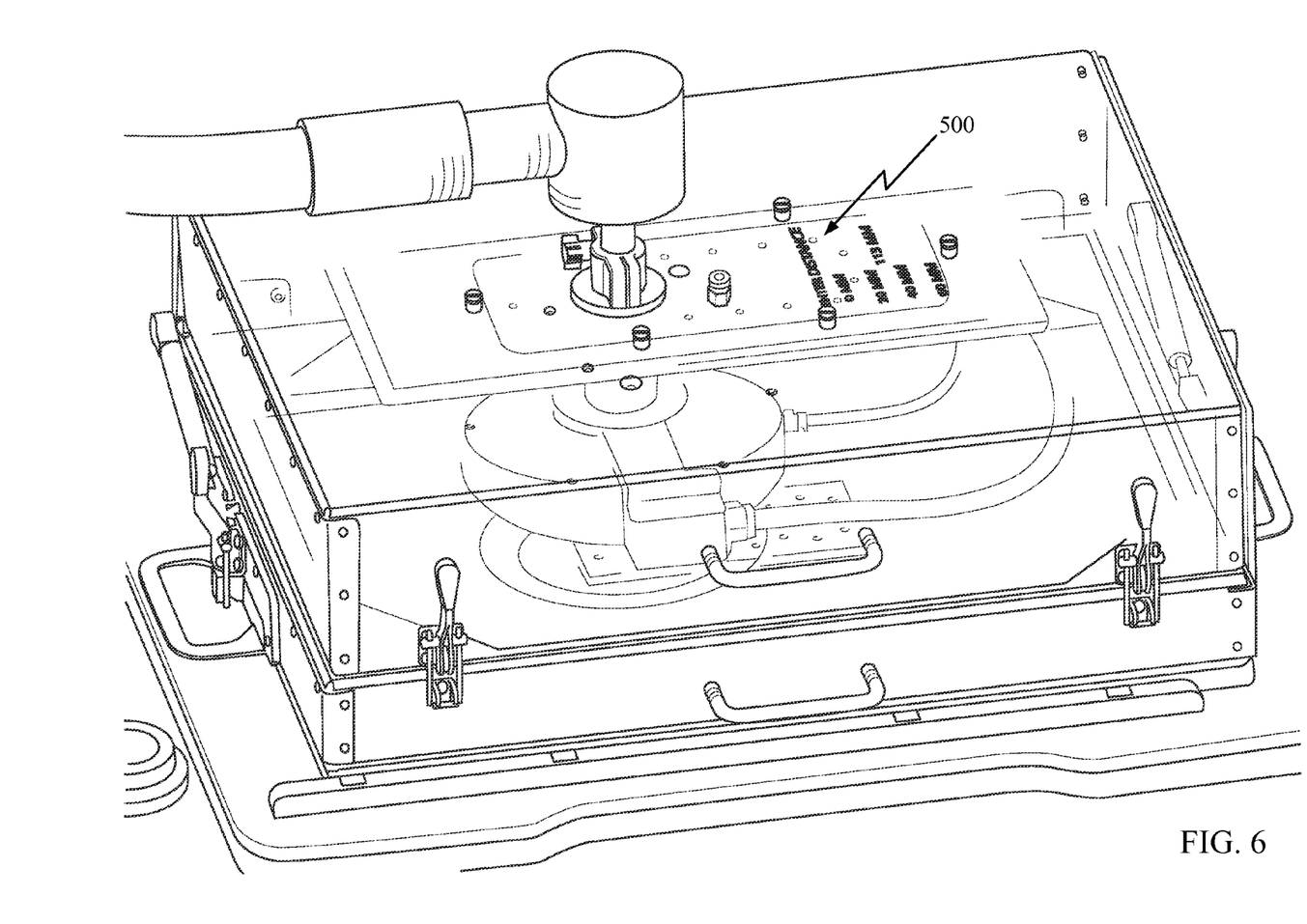
FIG. 6 is a drawing with the lid transparent showing the positioning plate's overall dimensions.

FIGS. 5 and 6 show positioning plate 500.

In FIG. 5, positioning plate 500 is attached to RF shielded enclosure 100 and allows for positioning of environmental control chamber 440 which is inside the enclosure. Positioning plate 500 is of a larger dimension than the opening in RF shielded enclosure 100. This oversize allows for varying the positions of positioning plate 500 along two axis without creating an unwanted gap between the plate 500 and RF shielded enclosure 100. A gap would allow RF energy to disperse freely from or into RF shielded enclosure 100.

Captive screws 510 hold positioning plate 500 in place once proper positioning is achieved. Those skilled in the art would understand that alternative attachment and alignment techniques may be used.

Marked onto the outside surface of positioning plate 500 where it is easily visible are indicators of the measured position of the positioning plate 500 and therefore the relative location of the environmental control chamber 440 in relation to the inside test structure.

There is shown clamp 520 through which environmental control chamber 440 is connected. The clamp 520 allows for vertical adjustment of the environmental control chamber 440 inside. Inside this clamp additional EMI restrictive material (not shown) is positioned around the interior of the hole through which the environmental control chamber 440 mounting shaft 530 passes. This seals the shaft 530 as to EMI energy yet still allows for the vertical movement of the mounting shaft 530 in relation to the RF shielded enclosure 100.

Therefore three axis alignment of the environmental control chamber 440 inside of the RF shielded enclosure 100 is achieved. Those of skill in the art would understand that the axis of alignment could be practiced by other means comprising, movable slots, grooves or channels, low friction surface bearings, linear actuators and robotic manipulators.

The environmental control chamber 440 receives warm air through warm air input 540. The warm air after being used is discharged into the RF shielded enclosure and allowed to escape. Conditioned air delivered to environmental control chamber 440 through shaft 530 is exhausted through air exhaust 550.

Figure 7:
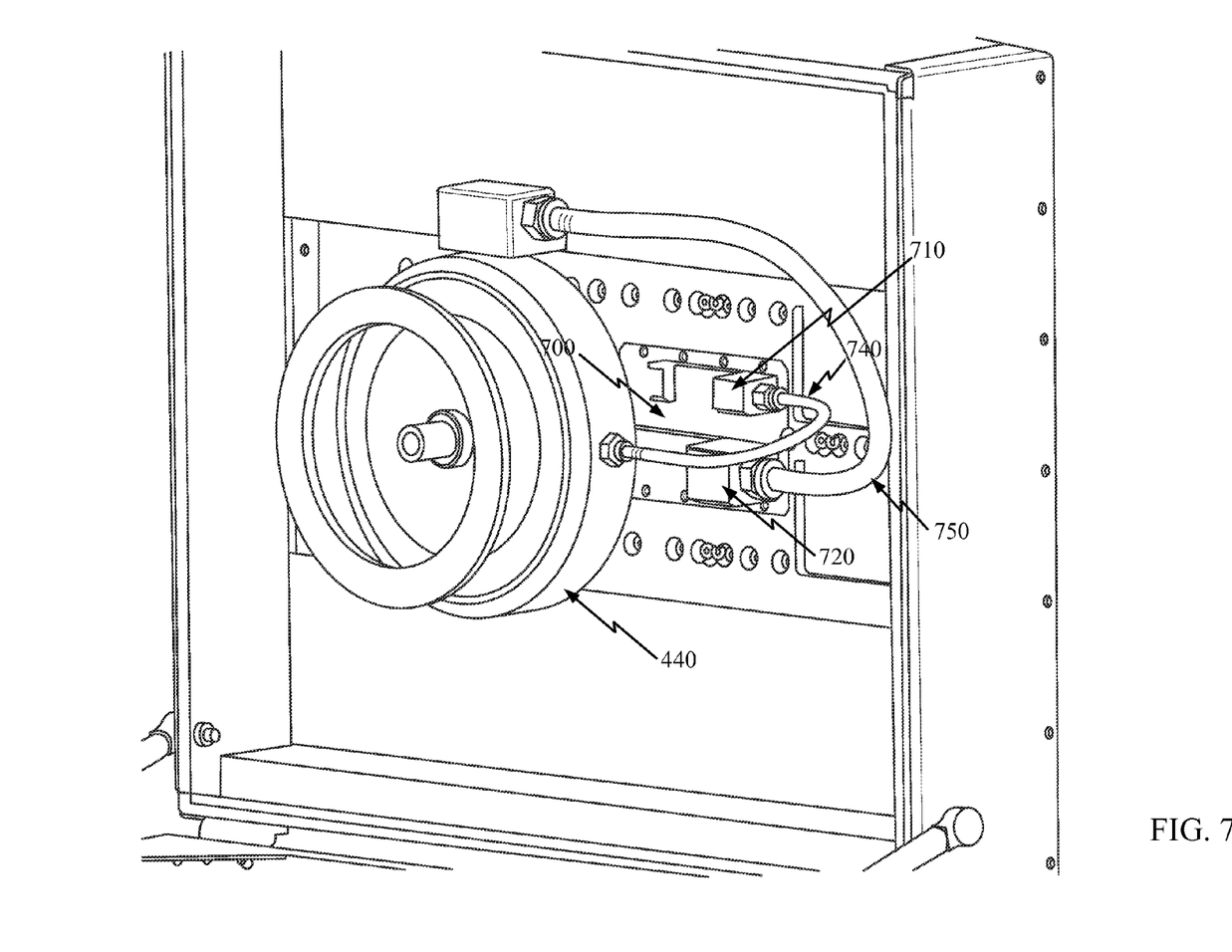
FIG. 7 is a drawing of the inside of the lid showing the RF cavity filter.

FIG. 7 shows the under side of positioning plate 500 with filter 700. Filter 700 contains warm air cavity filter 710 and exhaust air cavity filter 720. Those skilled in the art would understand that the filters do not have to be co-located or that the number and types of total filters may be different or variable as the test setup requires.

Warm air delivered through warm air input 540 is delivered to the environmental control chamber 440 through warm air conduit 740. Conditioned air that has been used exhausts from the environmental control chamber 440 through air exhaust conduit 750.

Figure 8:
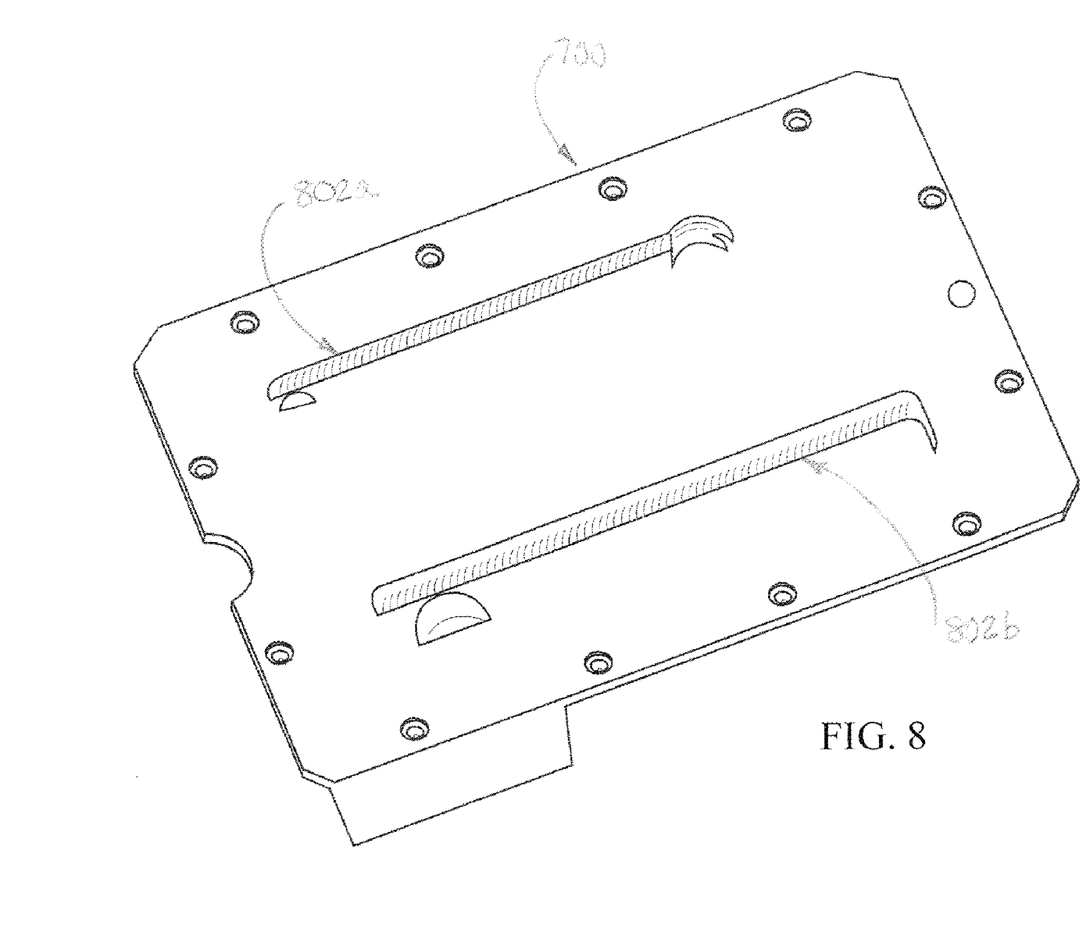
FIG. 8 is a drawing showing details of the RF cavity filter.

FIG. 8 shows the cavities 802*a* and 802*b* of filter 700. Many factors go into arriving at design dimensions for the cavity filter that restricts the passage of RF energy. Through trial and error or through careful calculations the relationship between length and the other dimensions of the cavity as well as the entry and exit holes define how well the cavity filter will work in the particular test set up and for particular frequencies.

Figure 9:
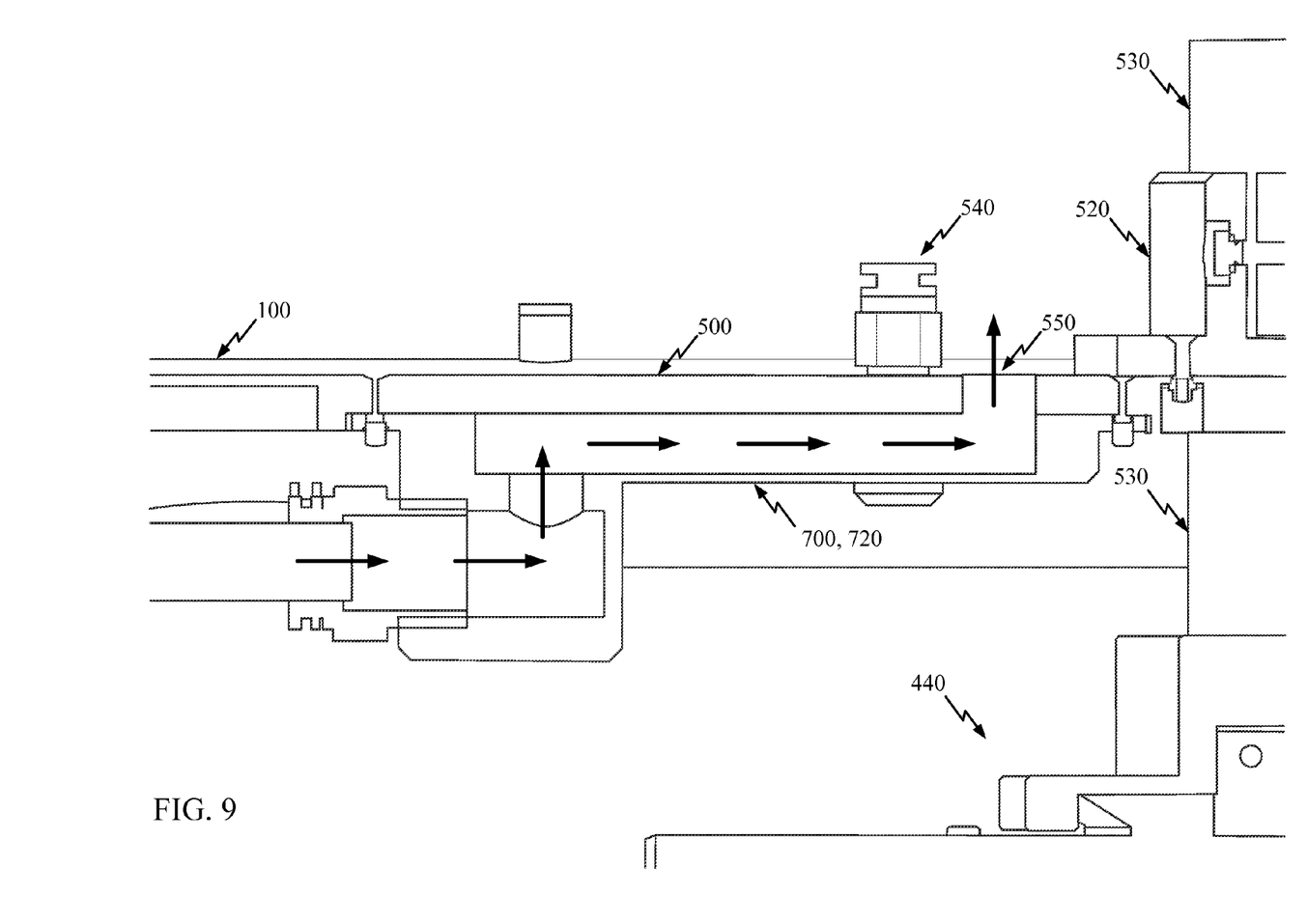
FIG. 9 is a cutaway drawing of exhaust air cavity filter.

FIG. 9 shows the path for used conditioned air through the exhaust air cavity filter 720 and through positioning plate 500 as it exits the RF shielded enclosure 100.

Figure 10:
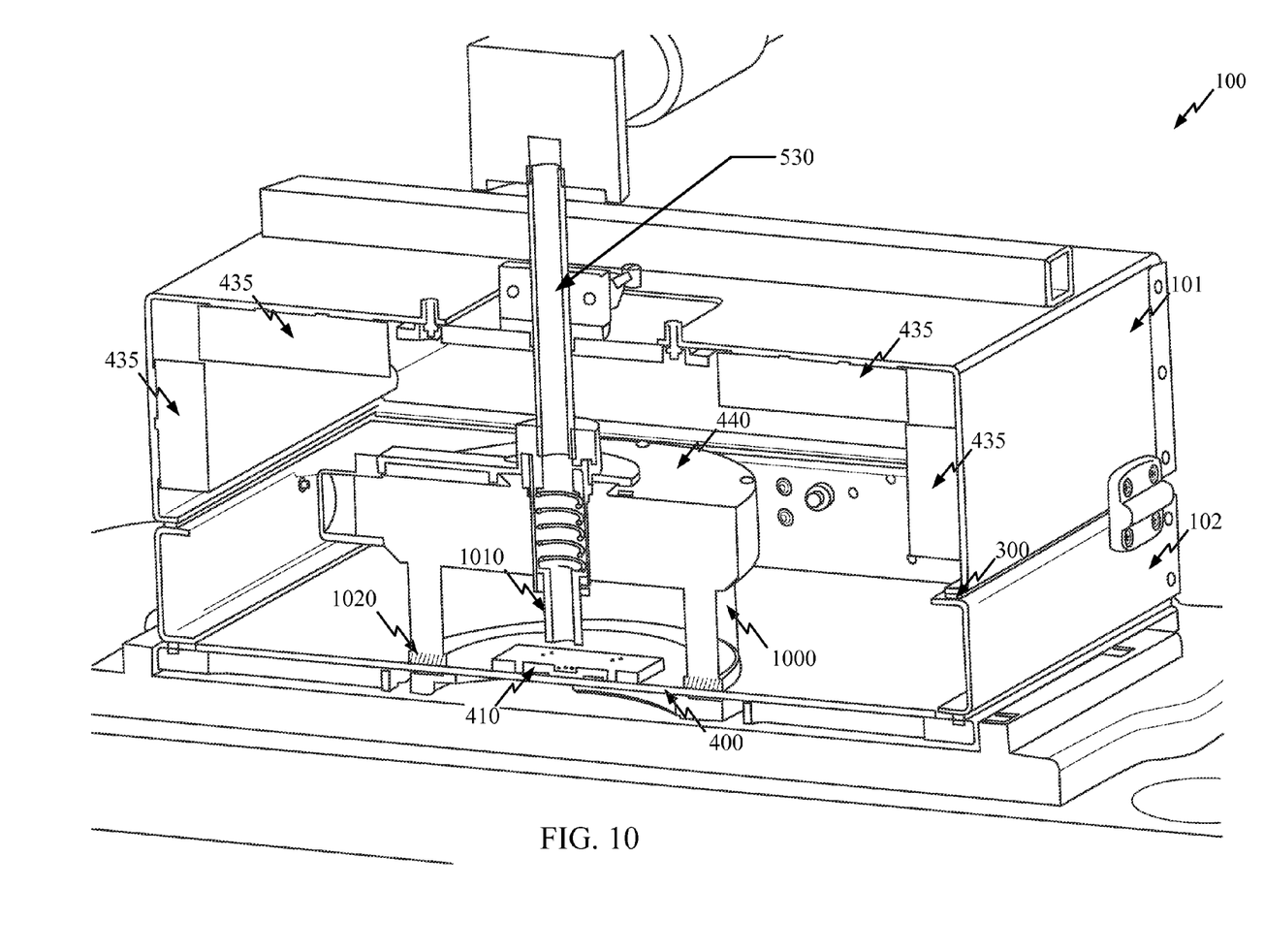
FIG. 10 is a cutaway drawing of the environmental control chamber.

FIG. 10 shows in a cutaway view more detail of the environmental control chamber 440 with the RF shielded enclosure 100 lid 101 closed. Environmental control chamber 440 encapsulates test sockets 410 by contacting the surface of test interface board 400 in a circular manner around test sockets 410. A seal 1020 of soft pliable material such as rubber is used to ensure an air resistant seal 1020 around test sockets 410. The pliable seal 1020 also is attached in such a way as to allow the warm air received through warm air input 540 and warm air conduit 740 to escape into the RF shielded enclosure 100 but not into the interior of the environmental control chamber 440 where devices are under test.

During testing conditioned air is brought to the device under test. For example a microprocessor is being tested. The conditioned air is directed onto the surface of the microprocessor by way of a spring loaded conditioned air nozzle 1010. By adjusting mounting shaft 530 the environmental control chamber 440 is brought down toward test interface board 400. The air nozzle 1010 makes contact with the microprocessor and the spring deflects as needed to allow environmental control 440 to be lowered further onto and seal with test interface board 400.

Conditioned air physical properties comprising temperature, humidity and pressure are cycled over time as required by the particular test scenario for the device being tested. This cycling of physical properties can result in the build up of condensation within the RF shielded enclosure 100. The warm air circulated through warm air chamber 1000 assists with reducing the build up of condensation.

Dry or hot air or gas injection systems can be integrated into a RF shielded enclosure 100 for automated testing applications. The added stream of heated air or dry gas reduces condensation and formation of ice when cold environmental conditions are simulated. The dry or heated air or gas can be applied directly to the device under test or within a shroud covering within the RF Shielded Enclosure.

A hot/cold plate can be integrated with RF shielded enclosure 100 to conductively cool or heat a device under test. The hot/cold plate could comprise Peltier, resistive, vapor phase change or circulating liquid/gas/air heating/cooling methods. The hot/cold plate can be part of the holding fixture for the device under test that clamps the device under test to its electrical contact socket on the test interface board.

Those skilled in the art would recognize that test equipment other than environmental control chamber 440 could be used with RF shielded enclosure 100. Because of the high degree of adjustment and flexibility in the RF shielded enclosure varying pieces of test equipment can be easily substituted for the environmental control chamber 440 discussed.

In the foregoing detailed description, the present invention has been described with reference to specific exemplary embodiments. It will be evident that various modifications and changes may be made without departing from the broader scope and spirit of the present invention. The specification and figures are accordingly to be regarded as illustrative rather than restrictive.

The invention claimed is:

1. An apparatus for restricting the flow of radio frequency (RF) energy when attached to a tester wherein test equipment is positioned within the apparatus, comprising:
   a lid;
   a base;
   hinges for attaching the lid to the base;
   electromagnetic interference (EMI) gasket material for sealing seams;
   latches for attaching the lid to the base and for applying forces between the lid and the base to provide compression of the EMI gasket material for proper sealing of the seams;
   an environmental control chamber;
   a connection point for providing two axis alignment of the base to the tester; and
   a positioning plate for providing three axis alignment of the environmental control chamber in relation to the tester.

2. The apparatus of claim 1 wherein the positioning plate further comprises:
   passages for air, comprising conditioned air and warm air;
   mounting location for RF filters;
   clamp for holding a mounting shaft, the mounting shaft passes from exterior of lid to interior of lid through the clamp, the clamp comprises EMI shielding material; and
   markings on the surface for identifying location of the positioning plate in relation to the tester.

3. The apparatus of claim 1 wherein the connection point further comprises:
   an alignment plate attached to the base;
   a latching clamp for providing forces to securely connect the base to the tester and for compressing the EMI gasket material for proper sealing of the seams; and
   a handle, the handle designed so that two axis alignment is achieved when used with the alignment plate mounted to the base.

4. The apparatus of claim 1 further comprising EMI absorbing material for absorbing reflected RF energy.

5. The apparatus of claim 1 further comprising RF cavity filters.

6. The apparatus of claim 1 further comprising conduits for providing connection paths between test equipment and RF cavity filters.

7. The apparatus of claim 1 further comprising handles for transport and manipulation of lid.

8. A method for restricting the flow of radio frequency (RF) energy when testing under a test plan wherein an apparatus is attached to a tester and test equipment is positioned within the apparatus, the method comprising:
   attaching the apparatus to the tester, the apparatus comprising:
      a lid;
      a base;
      hinges for attaching the lid to the base;
      electromagnetic interference (EMI) gasket material for sealing seams;
      an environmental control chamber;
      latches for attaching the lid to the base and for applying forces between the lid and the base to provide compression of the EMI gasket material for proper sealing of the seams;
      an environmental control chamber
      a connection point for providing two axis alignment of the base to the tester; and
      a positioning plate for providing three axis alignment of the environmental control chamber in relation to the tester; and,
   operating the tester and test equipment according to the test plan.

9. An apparatus for restricting the flow of radio frequency (RF) energy when attached to a tester wherein test equipment is positioned within the apparatus, comprising:
   a lid;
   a base;

means for attaching the lid to the base, wherein the lid may be opened;
electromagnetic (EMI) gasket material for sealing seams;
means for attaching the lid to the base wherein forces are applied between the lid and the base to provide compression of the EMI gasket material for proper sealing of the seams;
means for providing a connection point for providing two axis alignment of the base to the tester; and
means for providing a positioning plate for providing three axis alignment of the environmental control chamber in relation to the tester.

10. A method for restricting the flow of radio frequency (RF) energy when testing under a test plan wherein an apparatus is attached to a tester and test equipment is positioned within the apparatus, the method comprising:
means for attaching the apparatus to the tester, the apparatus comprising:
a lid;
a base;
hinges for attaching the lid to the base;
electromagnetic interference (EMI) gasket material for sealing seams;
latches for attaching the lid to the base and for applying forces between the lid and the base to provide compression of the EMI gasket material for proper sealing of the seams;
an environmental control chamber;
a connection point for providing two axis alignment of the base to the tester; and
a positioning plate for providing three axis alignment of the environmental control chamber in relation to the tester; and,
means for operating the tester and test equipment according to the test plan.

* * * * *